United States Patent
Zhang et al.

(10) Patent No.: US 12,176,442 B2
(45) Date of Patent: Dec. 24, 2024

(54) CHARGE BALANCED POWER SCHOTTKY BARRIER DIODES

(71) Applicant: Virginia Tech Intellectual Properties, Inc., Blacksburg, VA (US)

(72) Inventors: Yuhao Zhang, Blacksburg, VA (US); Ming Xiao, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 496 days.

(21) Appl. No.: 17/519,898

(22) Filed: Nov. 5, 2021

(65) Prior Publication Data
US 2023/0143171 A1   May 11, 2023

(51) Int. Cl.
*H01L 29/872* (2006.01)
*H01L 29/20* (2006.01)
*H01L 29/205* (2006.01)
*H01L 29/24* (2006.01)

(52) U.S. Cl.
CPC ........ *H01L 29/872* (2013.01); *H01L 29/2003* (2013.01); *H01L 29/205* (2013.01); *H01L 29/24* (2013.01)

(58) Field of Classification Search
CPC ............... H01L 29/872; H01L 29/2003; H01L 29/205; H01L 29/24; H01L 29/0657; H01L 29/063; H01L 29/417
See application file for complete search history.

(56) References Cited

U.S. PATENT DOCUMENTS

| | | | | |
|---|---|---|---|---|
| 2009/0020843 A1* | 1/2009 | Hebert | ................ | H01L 29/861 257/E29.104 |
| 2009/0114948 A1* | 5/2009 | Ishida | ................ | H01L 29/872 257/E29.068 |
| 2013/0221409 A1* | 8/2013 | Nakajima | ............. | H01L 29/872 257/194 |

(Continued)

OTHER PUBLICATIONS

Jeffrey B. Casady et al.; "New Generation 10kV SiC Power MOSFET and Diodes for Industrial Applications"; PCIM Europe 2015; May 19-21, 2015 Nuremberg, Germany; pp. 96-103; VDE Verlag GMBH, Berlin, Offenbach; ISBN 978-3-8007-3924-0.

(Continued)

*Primary Examiner* — Fernando L Toledo
*Assistant Examiner* — Marshall Mu-Nuo Hatfield
(74) *Attorney, Agent, or Firm* — Thomas | Horstemeyer, LLP (57) ABSTRACT

A diode includes a semiconductor region having at least one two-dimensional carrier channel of a first conductivity type, the first conductivity type being one of a n-type and a p-type conductivity, the at least one two-dimensional channel having a net charge; a material of a second conductivity type, the second conductivity type being the other of the n-type and the p-type conductivity, disposed on the semiconductor region, the material of the second conductivity type having a net-charge in a depletion region that is substantially equal to the net-charge of the at least one two-dimensional channel in the semiconductor region when the diode is under reverse bias; an anode material in contact with at least a portion of the at least one two-dimensional channel and at least a portion of the material of the second conductivity type; and a cathode material in contact with the at least one two-dimensional carrier channel.

20 Claims, 6 Drawing Sheets

(56) References Cited

U.S. PATENT DOCUMENTS

| | | | |
|---|---|---|---|
| 2015/0014696 A1* | 1/2015 | Chen | H01L 29/7787 438/172 |
| 2015/0249134 A1* | 9/2015 | Ostermaier | H01L 29/785 257/76 |
| 2015/0303292 A1* | 10/2015 | Shibata | H01L 29/2003 257/76 |
| 2019/0067491 A1* | 2/2019 | Blanchard | H01L 29/6609 |
| 2020/0185542 A1* | 6/2020 | Lian | H01L 29/872 |
| 2020/0235217 A1* | 7/2020 | Knaipp | H01L 29/47 |
| 2021/0005759 A1* | 1/2021 | Then | H01L 29/861 |

OTHER PUBLICATIONS

Hiroshi Ohta et al.; "5.0 kV breakdown-voltage vertical GaN p-n junction diodes"; 2018 Jpn. J. Appl. Phys. 57 04FG09; pp. 04FG09-1-04FG09-1.

Tetsuro Hayashida et al,; "Vertical GaN merged PiN Schottky diode with a breakdown voltage of 2 kV"; 2017 Appl. Phys. Express 10 061003; pp. 061003-1-061003-3.

Yuhao Zhang; "(Ultra)Wide-Bandgap Vertical Power FinFETs"; IEEE Transactions On Electron Devices, vol. 67, No. 10, Oct. 2020; pp. 3960-3971.

Tohru Oka; "Recent development of vertical GaN power devices"; 2019 Jpn. J. Appl. Phys. 58 SB0805; pp. SB0805-1-SB0805-12.

J. Liu et al.; "1.2 kV Vertical GaN Fin JFETs with Robust Avalanche and Fast Switching Capabilities"; 2020 IEEE International Electron Devices Meeting (IDEM); DOI: 10.1109/IEDM13553.2020.9372048; pp. 23.2.1-23.2.4.

Albert Colon et al.; "Demonstration of a 9 kV reverse breakdown and 59 mΩ-cm2 specific onresistance AlGaN/GaN Schottky barrier diode"; Solid State Electronics 151 (2019) 47-51.

Hidetoshi Ishida et al.; "GaN-based Natural Super Junction Diodes with Multi-channel Structures"; Semiconductor Device Research Center, Panasonic Corporation. 1 Yakemachi Kotari Nagaokakyo, Kyoto, 617-8520, Japan.

Ming Xiao et al.; "3.3 kV Multi-Channel AlGaN/GaN Schottky Barrier Diodes With P-GaN Termination"; IEEE Electron Device Letters, vol. 41, No. 8, Aug. 2020; pp. 1177-1180.

Jun Ma et al.; "1200 V Multi-Channel Power Devices with 2.8 Ω•mm ON-Resistance"; 2019 IEEE; pp. 4.1. 1-4.1 .4.

Yuhao Zhang et al.; "GaN FinFETs and trigate devices for power and RF applications: review and perspective"; Semicond. Sci. Technol. 36 (2021) 054001 (24pp).

M. Xiao et al.; "5 kV Multi-Channel AlGaN/GaN Power Schottky Barrier Diodes with Junction-Fin-Anode"; 2020 IEEE International Electron Devices Meeting (IEDM); pp. 5.4.1-5.4.4.

Sang-Wo Han et al.; "Experimental Demonstration of Charge-Balanced GaN Super-Heterojunction Schottky Barrier Diode Capable of 2.8 kV Switching"; IEEE Electron Device Letters, vol. 41, No. 12, Dec. 2020; pp. 1758-1761.

Yuhao Zhang et al.; "Electrothermal Simulation and Thermal Performance Study of GaN Vertical and Lateral Power Transistors"; IEEE Transactions On Electron Devices, vol. 60, No. 7, Jul. 2013; pp. 2224-2230.

Chuan-Wei Tsou et al.; "2.07-KV AlGaN/GaN Schottky Barrier Diodes on Silicon With High Baliga's Figure-of-Merit"; IEEE Electron Device Letters, vol. 37, No. 1, Jan. 2016; pp. 70-73.

Jun Ma et al.; "2 KV slanted tri-gate GaN-on-Si Schottky barrier diodes with ultra-low leakage current"; Appl. Phys. Lett. 112, 052101 (2018); pp. 052101-1-052101-4.

Tao Zhang et al. "A > 3 kV/2.94 m • cm2 and Low Leakage Current With Low Turn-On Voltage Lateral GaN Schottky Barrier Diode on Silicon Substrate With Anode Engineering Technique"; IEEE Electron Device Letters, vol. 40, No. 10, Oct. 2019; pp. 1583-1586.

Justin Lynch et al.; "Design Considerations for High Voltage SiC Power Devices: An Experimental Investigation into Channel Pinching of 10KV SiC Junction Barrier Schottky (JBS) Diodes"; Proceedings of the 31st International Symposium on Power Semiconductor Devices & ICs, May 19-23, 2019, Shanghai, China; pp. 223-226.

J. Millan et al.; "High-Voltage SiC Devices: Diodes and MOSFETs"; 2015 IEEE; pp. 11-18.

J. Schoeck et al.; "4.5 kV SiC Junction Barrier Schottky Diodes with Low Leakage Current and High Forward Current Density"; Materials Science Forum, ISSN: 1662-9752, vol. 897, pp. 427-430.

Reza Ghandi et al.; "3kV SiC Charge-Balanced Diodes Breaking Unipolar Limit"; Proceedings of the 31st International Symposium on Power Semiconductor Devices & ICs, May 19-23, 2019, Shanghai, China; pp. 179-182.

Wenshen Li et al., "Field-Plated Ga2O3 Trench Schottky Barrier Diodes With a BV2/Ron,sp of up to 0.95 GW/cm2"; IEEE Electron Device Letters, vol. 41, No. 1, Jan. 2020; pp. 107-110.

Zhuangzhuang Hu et al.; "Field-Plated Lateral—Ga2O3 Schottky Barrier Diode With High Reverse Blocking Voltage of More Than 3 kV and High DC Power Figure-of-Merit of 500 MW/cm2"; IEEE Electron Device Letters, vol. 39, No. 10, Oct. 2018; pp. 1564-1567.

Ruizhe Zhang et al.; "Surge-Energy and Overvoltage Ruggedness of P-Gate GaN HEMTs"; IEEE Transactions On Power Electronics, vol. 35, No. 12, Dec. 2020; pp. 13409-13419.

GAP3SLT33-214, 3300V 0.3A SiC Schottky MPS (TM) Diode; Silicon Carbide Schottky Diode; Published by GeneSiC Semiconductor, Inc.; Apr. 20 Rev 1.4; pp. 1-6.

Yuhao Zhang et al.; "Gallium nitride vertical power devices on foreign substrates: a review and outlook"; 2018 J. Phys. D: Appl. Phys. 51 273001; pp. 1-13.

* cited by examiner

CHARGE BALANCED POWER SCHOTTKY BARRIER DIODES

TECHNICAL FIELD

This disclosure relates to the semiconductor devices, an in particular to Schottky barrier diodes.

DESCRIPTION OF THE RELATED TECHNOLOGY

Various power electronic applications such as, for example, renewable energy generation, industrial motor drives, the electricity grid, and transportation utilize high-voltage power rectifiers. Bipolar silicon diodes based rectifiers are available for high voltage applications, but suffer from slow switching speeds. Some unipolar silicon-carbide junction barrier Schottky (JBS) diodes are also can operate at high voltages but suffer from high manufacturing costs. Gallium-nitride based diodes can exhibit superior properties compared to those of both silicon based and silicon carbide based diodes. For example, some gallium-nitride based diodes can operate at higher voltages than the silicon based and the silicon-carbide based diodes, but can suffer from high peak electric fields that limit the voltages under which these diodes can reliably operate.

SUMMARY

In one aspect of the disclosure, a diode, includes a semiconductor region having at least one two-dimensional carrier channel of a first conductivity type, the first conductivity type being one of a n-type and a p-type conductivity, the at least one two-dimensional channel having a net charge. The diode further includes a material of a second conductivity type, the second conductivity type being the other of the n-type and the p-type conductivity, disposed on the semiconductor region, the material of the second conductivity type having a net charge that is substantially equal to the net charge of the at least one two-dimensional channel in the semiconductor region when the diode is under reverse bias. The diode also includes an anode material in contact with at least a portion of the at least one two-dimensional channel and in contact with at least a portion of the material of the second conductivity type, and a cathode material in contact with the at least one two-dimensional carrier channel.

In some implementations, the net charge of the material of the second conductivity type is a function of a thickness of the material of the second conductivity type and an acceptor/donor concentration in the material of the second conductivity type. In some implementations, the material of the second conductivity type includes a first portion in contact with the anode material and a second portion in contact with the cathode material, wherein the first portion and the second portion are not in mutual contact. In some implementations, the diode further includes a passivation material disposed between the first portion and the second portion and in contact with the semiconductor region. In some implementations, the material of the second conductivity type makes contact with the anode material but does not make contact with the cathode material. In some implementations, the diode further includes a passivation material disposed between the material of the second conductivity type and the cathode material. In some implementations, the material of the second conductivity type makes contact with both the anode material and the cathode material.

In some implementations, under reverse bias, the material of the second conductivity type forms a depletion region adjacent to the semiconductor region, wherein the net charge in the depletion region is substantially equal to the net charge of the at least one two-dimensional channel in the semiconductor region. In some implementations, the reverse bias is at least 10 V. In some implementations, a portion of the anode forms a Schottky contact with the portion of the semiconductor region, and wherein the depletion region is positioned between the Schottky contact and the cathode. In some implementations, the net charge of the at least one two-dimensional channel is equal to a sum of net charges of all two-dimensional channels of the at least one two-dimensional channel. In some implementations, the semiconductor region includes at least one III-nitride material.

In some implementations, the diode further includes a substrate layer, and a buffer layer disposed over the substate layer, wherein the semiconductor region having the at least one two-dimensional carrier channel of a first conductivity type is disposed over the buffer layer. In some implementations, the at least one two-dimensional carrier channel is formed at an interface of an aluminum gallium nitride material and a gallium nitride material. In some implementations, the material of the second conductivity type is doped in a graded configuration. In some implementations, the material of the second conductivity type is doped in a bulk configuration. In some implementations, the at least one two-dimensional channel of the semiconductor region is a first at least one two-dimensional channel, and wherein the material of the second conductivity type includes a second two-dimensional channel. In some implementations, the cathode material forms an ohmic contact with the at least one two-dimensional channel. In some implementations, the material of the second conductivity type has a net charge that is within 30% of the net charge of the at least one two-dimensional channel in the semiconductor region.

DETAILED DESCRIPTION

The various concepts introduced above and discussed in greater detail below may be implemented in any of numerous ways, as the described concepts are not limited to any particular manner of implementation. Examples of specific implementations and applications are provided primarily for illustrative purposes.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

Prior to describing the various aspects of the present disclosure, the following definitions are provided and should be used unless otherwise indicated. Additional terms may be defined elsewhere in the present disclosure.

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of.

As used herein, the term "and/or" includes any and all combinations of one or more of the associated listed items. Expressions such as "at least one of," when preceding a list of elements, modify the entire list of elements and do not modify the individual elements of the list.

As used in the specification and the appended claims, the singular forms "a," "an" and "the" include plural referents unless the context clearly dictates otherwise. Thus, for example, reference to "a proton beam degrader," "a degrader foil," or "a conduit," includes, but is not limited to, two or more such proton beam degraders, degrader foils, or conduits, and the like.

The various concepts introduced above and discussed in greater detail below may be implemented in any of numerous ways, as the described concepts are not limited to any particular manner of implementation. Examples of specific implementations and applications are provided primarily for illustrative purposes.

As used herein, the terms "optional" or "optionally" means that the subsequently described event or circumstance can or cannot occur, and that the description includes instances where said event or circumstance occurs and instances where it does not.

Unless otherwise specified, temperatures referred to herein are based on atmospheric pressure (i.e. one atmosphere). In some traditional Schottky barrier diodes (SBDs) (also referred to herein as "Schottky diodes")

Figure 1:
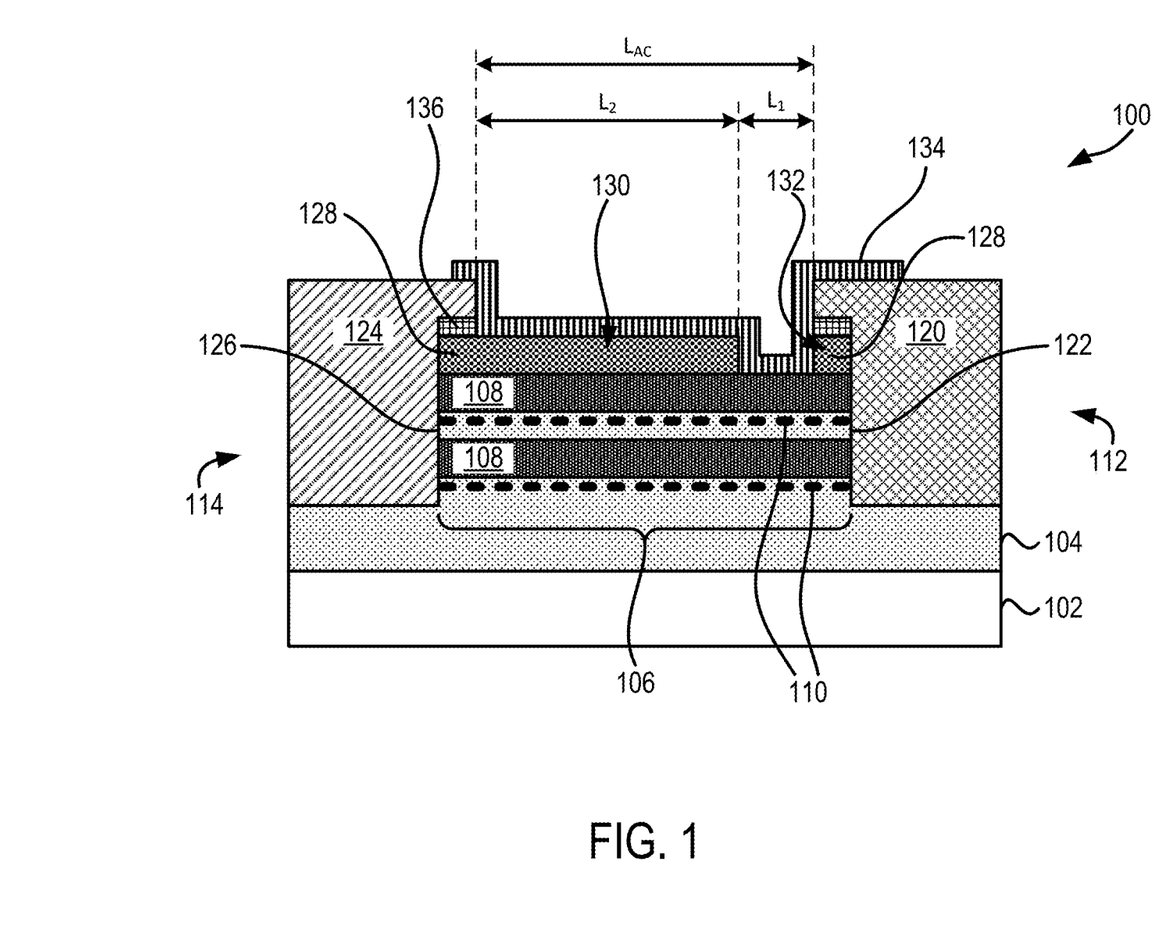
FIG. 1 shows a first example Schottky diode.

FIG. 1 shows a first example Schottky diode 100. In particular, the first example Schottky diode 100 can provide a high breakdown voltage operation while lowering the magnitude of electric fields within the diode. The Schottky diode 100 includes a substrate 102 and a gallium nitride layer (i-GAN layer 104) positioned over the substrate 102. The substrate 102 can be any suitable material over which the i-GAN layer 104 can be formed. The substrate 102 can include materials such as, for example, silicon, sapphire, diamond, silicon carbide (SiC), aluminum nitride (AlN), etc. In some examples, the Schottky diode 100 can include a buffer layer positioned between the substrate 102 and the i-GAN layer 104, to improve the structural reliability of the Schottky diode 100 by forming a transition layer between the substrate 102 and the i-GAN layer 104. The buffer layer can adjust for thermal mismatch between the substrate 102 and the i-GAN layer 104.

A semiconductor region 106 can be formed over the i-GAN layer 104. The semiconductor region 106 includes alternating layers of aluminum gallium nitride (AlGaN) and GaN, also referred to as a AlGaN/GaN heterostructure. Although, the semiconductor region 106 can include any one of the Group III-nitride materials. Spontaneous and strain induced polarization can lead to a high positive polarization in the AlGaN layer 108, resulting in at least one two-dimensional carrier channel 110. In some instances, the at least one two-dimensional carrier channel 110 can include at least one electron gas (2DEG) channel induced at the AlGaN/GaN interface. The 2DEG channels extend laterally between a first end 112 of the Schottky diode 100 and a second end 114 of the Schottky diode 100. The semiconductor region 106 can include one or more 2DEG channels. As each 2DEG channel is formed at an interface of a AlGaN layer and a GaN layer, multiple 2DEG channels can be formed by including multiple alternating AlGaN and GaN layers. In the example shown in FIG. 1, the semiconductor region 106 can have a first conductivity type of n-type. However, in some other examples, the semiconductor region 106 can have a p-type conductivity type instead. In some such examples, the semiconductor region 106 can include two-dimensional hole gas (2DHG) channels instead of 2DEG channels. The at least one two-dimensional carrier channel 110 can be formed at the interface of materials other than AlGaN and GaN. For example, materials such as AlGaO/GaO or AlN/AlGaN also can be used to form the at least one two-dimensional carrier channel 110.

A cathode material 120 can be disposed near the first end 112 of the Schottky diode 100. The cathode material 120 can be in contact with the semiconductor region 106, and in particular with the at least one two-dimensional carrier channel 110. The cathode material 120 can be disposed on a sidewall of the semiconductor region 106 near the first end 112, such that the cathode material 120 makes an ohmic contact with the at least one two-dimensional carrier channel 110. For example, as shown in FIG. 1, the cathode material 120 can make ohmic contact with the at least one two-dimensional carrier channel 110 at a first sidewall 122 of the semiconductor region 106. The cathode material 120 can include metals such as, for example, titanium, aluminum, nickel, gold, and other suitable metals.

An anode material 124 can be disposed near the second end 114 of the Schottky diode 100. The anode material 124 can be in contact with the semiconductor region 106, and in particular with the at least one two-dimensional carrier channel 110. The anode material 124 can be disposed on a sidewall of the semiconductor region 106 near the second end 114, such that the anode material 124 makes a Schottky contact with the at least one two-dimensional carrier channel 110. For example, as shown in FIG. 1, the anode material 124 can make a Schottky contact with the at least one two-dimensional carrier channel 110 at a second sidewall 126 of the semiconductor region 106. The anode material 124 can include metals such as, for example, titanium, aluminum, nickel, gold, and other suitable metals.

At least one material of a second conductivity type that is different from the first conductivity type of the semiconductor region 106 can be disposed over the semiconductor region 106. For example, referring to FIG. 1, a second conductivity type material 128 can be disposed over the top surface of the semiconductor region 106. Where the first conductivity of the semiconductor region 106 is n-type (p-type), the second conductivity of the second conductivity type material 128 can be p-type (n-type). At least one example of a p-type second conductivity type material 128 can include p-GaN and nickel oxide. At least one example of an n-type second conductivity type material 128 can include n-GaN, n-GaO, and n-AlGaN.

In one approach, the second conductivity type material 128 can include a first portion 130 in contact with the anode material 124 and a second portion 132 in contact with the cathode material 120, where the first portion 130 and the second portion 132 are not in mutual contact. In effect, there is a distance L1 between the first portion 130 and the second portion 132 of the second conductivity type material 128. As discussed below, the discontinuity in the second conductivity type material 128 can reduce leakage current in the Schottky diode 100. The reduction in the leakage current, in turn, can reduce the risk of punch-through. In addition, the discontinuity in the second conductivity type material 128 can also reduce the peak electric field near the Schottky contact and increase the average electric field in the Schottky diode 100. A decrease in the peak electric field can reduce the risk of the Schottky contact breaking down during high reverse bias voltages, thereby improving the reliability of the Schottky diode 100. As a result, the Schottky diode 100 can achieve a relatively higher breakdown voltage.

In some instances, the second portion 132 can be eliminated, resulting in the first portion 130 of the second conductivity type material 128 extending by a distance of L2 from the anode material 124. That is, the second conductivity type material 128 makes contact with the anode material 124 but does not make contact with the cathode material 120. The distance L1 can then represent the distance between the end of the first portion 130 nearest to the first end 112 and the cathode material 120. The portion of the semiconductor region 106 that is exposed from the removal of the second conductivity type material 128 can be covered with a passivation material 134. Thus, the passivation material 134 is disposed between the second conductivity type material 128 and the cathode material 120. The passivation material 134 can include one or more of aluminum oxide ($Al_2O_3$), silicon dioxide ($SiO_2$), silicon nitride ($Si_3N_4$), etc. In some examples, the value of L1 can be no more than half of the sum of the distance L1 and the distance L2.

In some other instances, the second conductivity type material 128 may be continuous, and extend between the anode material 124 and the cathode material 120. In particular, in instances where the risk of punch-through in the second conductivity type material 128 is low, the second conductivity type material 128 can make contact with both the anode material anode material 124 and the cathode material 120.

An insulating material 136 can be disposed between the second conductivity type material 128 and the anode material 124 and between the second conductivity type material 128 and the cathode material 120. In some instances, the insulating material 136 can be absent thereby causing the anode material 124 and the cathode material 120 to make contact with the top surface of the second conductivity type material 128.

Figure 2:
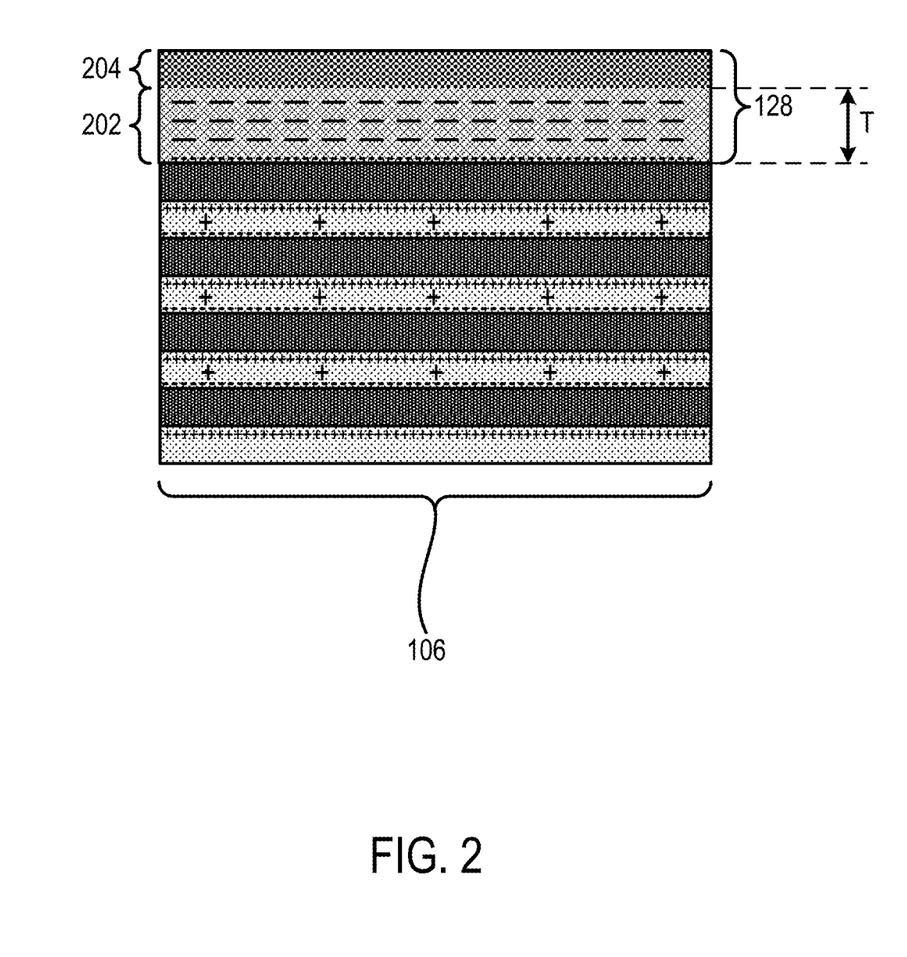
FIG. 2 shows a cross-sectional view of the depletion charge distribution in a portion of the Schottky diode shown in FIG. 1 at reverse bias.

FIG. 2 shows a cross-sectional view of the depletion charge distributions in a portion of the Schottky diode 100 shown in FIG. 1. In particular, FIG. 2 shows the semiconductor region 106 and the second conductivity type material 128 under reverse bias conditions. The at least one two-dimensional carrier channel 110 can have a net charge. In instances of where the at least one two-dimensional carrier channel 110 includes 2DEG channels, the net charge can be a positive, while in instances where the at least one two-dimensional carrier channel 110 includes 2DHG channels, the net charge can be negative. In particular, net donors provide electrons in the 2DEG channels, which electrons are depleted under reverse bias leaving behind positive net charges. Similarly, net acceptors provide the holes in the 2 DHG channels, which holes are depleted in reverse bias leaving behind negative net charges. The net charge of the semiconductor region 106 can be a sum of the net charges of each of the at least one two-dimensional carrier channel 110. For example, where the semiconductor region 106 include four 2DEG channels, the net charge of the semiconductor region 106 can be equal to the sum of the net charge of each of the four 2DEG channels.

The net charge of the second conductivity type material 128 can be equal to the acceptor concentration in the depletion region of the second conductivity type material 128 times the area of the second conductivity type material 128 times the thickness T of the depletion region in the second conductivity type material 128. The area of the second conductivity type material 128 can be the produce of a width and the length of the second conductivity type material 128 over the semiconductor region 106 in a plane that is normal to the plane in which the thickness T is measured. For example, referring to FIG. 1, the area of the 128 can be measured as a product of the length L2 times a width that is in a dimension normal to the page. The second conductivity type material 128 in the example Schottky diode 100 shown in FIG. 1 is a p-type material. In such examples, the second conductivity type material 128 is doped with acceptor material such as, for example, magnesium, zinc, cadmium, etc. In instances, where the second conductivity type material 128 n-type, the second conductivity type material 128 can be doped with donor materials such as, for example, substitutional silicon, substitutional germanium, substitutional oxygen, etc. In such examples, the net charge of the second conductivity type material 128 would be determined based on the donor concentration instead of the acceptor concentration mentioned above in relation to the p-type second conductivity type material 128.

Under reverse bias conditions, i.e., where the voltage at the anode material 124 is less than the voltage at the cathode material 120, the net charge at the depletion region 202 of the second conductivity type material 128 is substantially equal to the net charge at the semiconductor region 106. In particular, referring again to FIG. 2, the second conductivity type material 128 includes a depletion region 202 and a non-depletion region 204 under reverse bias conditions. The depletion region 202 includes negative acceptor ions. Similarly, positive donor ions are left behind in the semiconductor region 106. The depletion region 202 can extend from the second end 114 (FIG. 1) above a location where the anode material 124 makes a Schottky contact with the semiconductor region 106 up to a distance L2 from the second end 114. In some instances, as mentioned above, the second conductivity type material 128 may extend all the way to the cathode material 120. In some such instances, the depletion region 202 can extend entirely between the anode material 124 and the cathode material 120.

Under the reverse bias conditions, the net charge of the second conductivity type material 128 within the depletion region 202 is substantially equal to the net charge of the semiconductor region 106. For example, the negative acceptor ions in the depletion region 202 are substantially equal to the positive donor ions in the semiconductor region 106. As referred to herein, substantially equal means that the net charges are within ±30% of each other. For example, the net charge of the semiconductor region 106 can be considered substantially equal to the net charge of the second conductivity type material 128 if the value of the net charge of the semiconductor region 106 is within a range of 0.7 times to 1.3 times the net charge of the second conductivity type material 128 within the depletion region 202. Similarly, the net charge of the second conductivity type material 128 within the depletion region 202 can be considered substantially equal to the net charge of the semiconductor region 106 if the value of the net charge of the second conductivity type material 128 within the depletion region 202 is within a range of 0.7 times to 1.3 times the value of the net charge of the semiconductor region 106. In some examples, the substantially equal means that the net charges are within ±20% of each other. In some examples, substantially equal means that the net charges are within ±10% of each other. In some examples, substantially equal means that the net charges are within ±5% of each other. As an example, the reverse bias voltage can be at least 10 V. As another example, the reverse bias voltage can be at most 10 kV. In some examples, the reverse bias voltage can be at most 100 kV. In some other examples, the reverse bias voltage can be 1000 kV.

It should be noted that the thickness T of the depletion region 202 can vary based on the magnitude of the reverse bias voltage. That is, the thickness T of the depletion region 202 increases with an increase in the reverse bias voltage. In some instances, where the reverse bias voltage is high enough that the depletion region 202 extends the entire thickness of the second conductivity type material 128, the thickness T can be the thickness of the second conductivity type material 128.

In some examples, the second conductivity type material 128 can be uniformly doped. That is, the dopant concentration is uniform across the thickness T of the second conductivity type material 128. However, in some instances, the doping concentration may be non-uniform. For example, in some instances, the second conductivity type material 128 can be doped in a graded configuration. In a graded configuration, the doping concentration can increase or decrease incrementally as a function of the distance from the top or the bottom of the second conductivity type material 128. In some examples, the rate of increase in the doping concentration can be linear. In some other examples, the rate of increase in the doping concentration can be non-linear such as, for example, exponential, square of the distance, or some other non-linear function. In some examples, the second conductivity type material 128 can be doped in a bulk configuration, which includes doping in a three-dimensional configuration and is in contrast with delta doping, which results in a narrow doping profile.

FIGS. 1 and 2 above discuss the second conductivity type material 128 as bulk semiconductor material. However, in some examples, the second conductivity type material 128 can be similar to the semiconductor region 106 but with opposite polarity. For example, the second conductivity type material 128 can include one or more layers of semiconductors that form one or more two dimensional channels (e.g., one or more 2DEG channels or one or more 2DHG channels. The net charge of the one or more two-dimensional channels in the second conductivity type material 128 is substantially equal to the net charge of the one or more two-dimensional channels in the semiconductor region 106. As an example, if the semiconductor region 106 includes one or more 2DEG channels, then the semiconductor region 106 can include one or more 2DHG channels, where the net charge of the one or more 2DHG channels is substantially equal to the net charge of the one or more 2DEG channels.

Figure 3A:
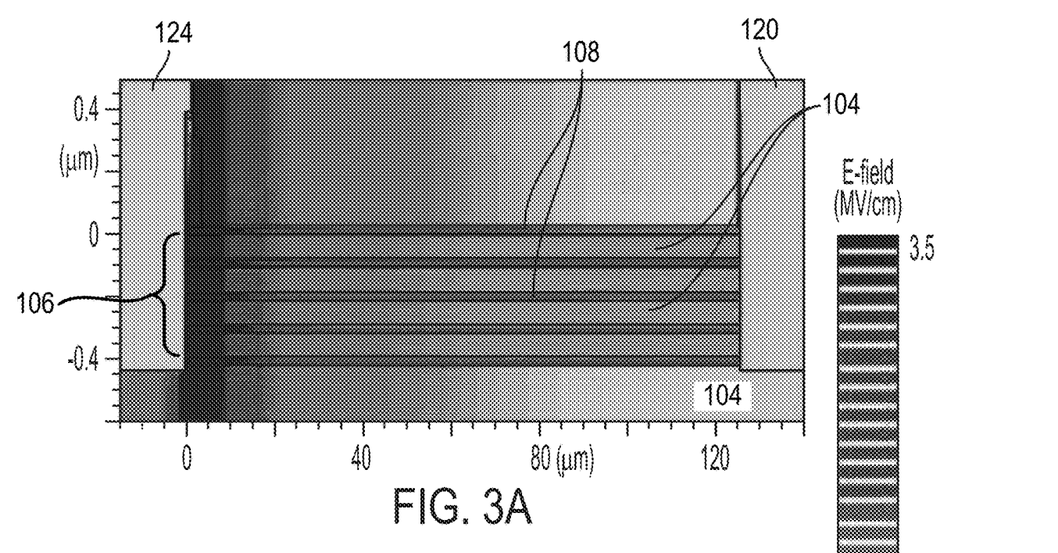
FIGS. 3A and 3B show simulated electric field distribution in Schottky diodes at reverse bias.
Figure 3B:
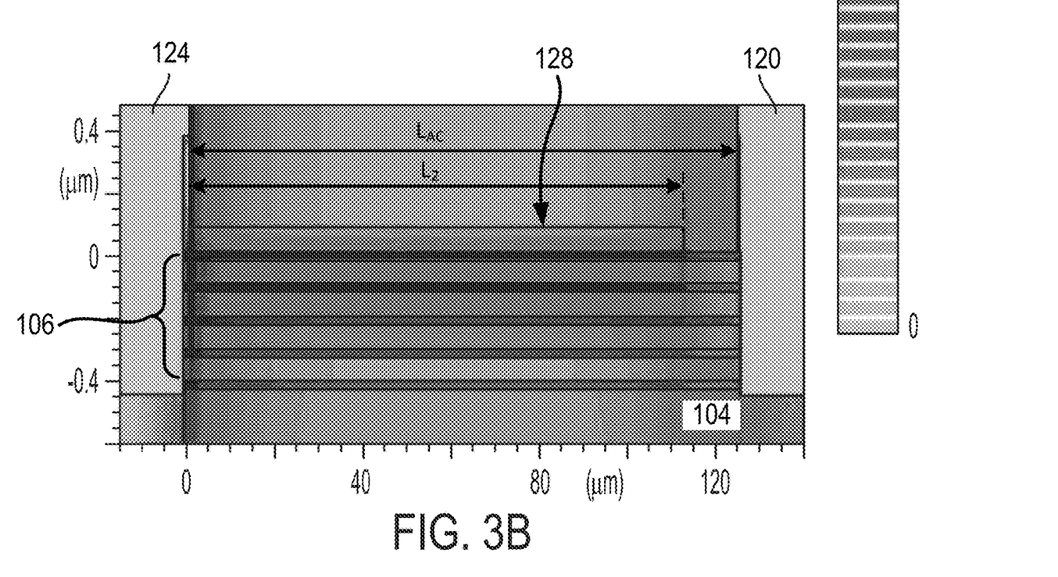

FIGS. 3A and 3B show simulated electric field distribution in Schottky diodes. In particular, FIG. 3A shows the electric filed distribution in a Schottky diode that includes a second conductivity type material that does not extend towards the cathode region, while FIG. 3B shows the electric field distribution in a Schottky diode such as, for example, the Schottky diode discussed above in relation to FIGS. 1-2. The simulation assumes a Schottky diode with a total length ($L_{AC}=L_1+L_2$) of about 123 µm and at a reverse bias voltage of about 10 kV. FIG. 3A shows electric field crowding near the Schottky contact formed between the anode material 124 and the semiconductor region 106. On the other hand, FIG. 3B shows the spreading of the electric field laterally along the extended second conductivity type material 128 and a reduction in the peak electric field near the Schottky contact between the anode region and the semiconductor region 106. Thus, for the same length $L_{AC}$, the Schottky diode associated with FIG. 3B can sustain higher breakdown voltages than the one associated with FIG. 3A.

Figure 4A:
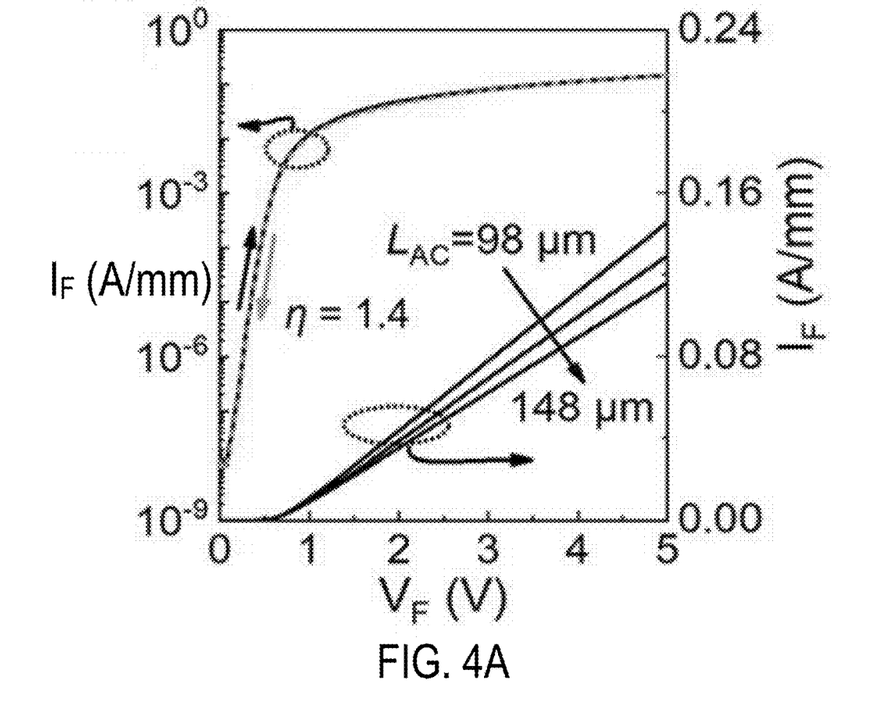
FIGS. 4A and 4B show plots of forward I-V characteristics of Schottky diodes.
Figure 4B:
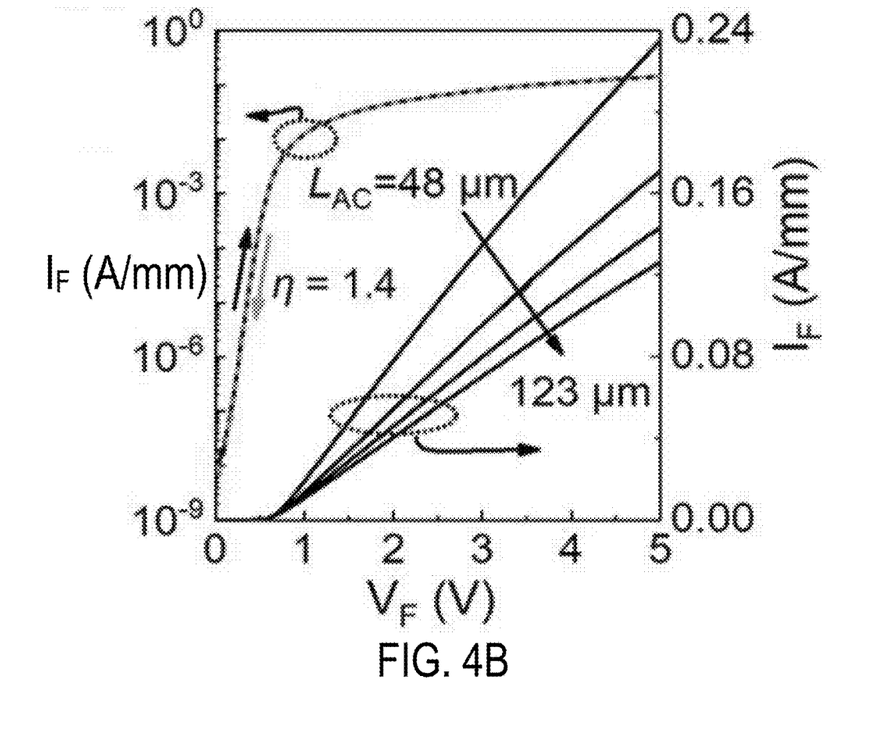

FIGS. 4A and 4B show plots of forward I-V characteristics of Schottky diodes. In particular, FIG. 4A shows the plot of the forward I-V characteristics of Schottky diodes that have the second conductivity type material that does not extend towards the cathode region for various lengths, while FIG. 4B shows the plot of the forward I-V characteristics of Schottky diodes such as, for example, the Schottky diode discussed above in relation to FIGS. 1-3B. The voltage is plotted on the x-axis, the left y-axis shows the current in semi-log scale, while the right y-axis shows the current in linear scale. The forward I-V characteristics in FIG. 4A are plotted for $L_{AC}$ of 98 µm, and 123 µm, and 148 µm, while the forward I-V characteristics in FIG. 4B are plotted for $L_{AC}$ of 48 µm, 73 µm, 98 µm, and 123 µm. The forward I-V characteristics in both FIGS. 4A and 4B indicate the same turn on voltage of about 0.6 V at 1 mA/mm. Further no hysteresis is observed in the double sweep of the voltage. For the same length of the Schottky diode, the on-resistance determined from the plots in FIG. 4B is similar to that determined from the plots in FIG. 4A.

Figure 5A:
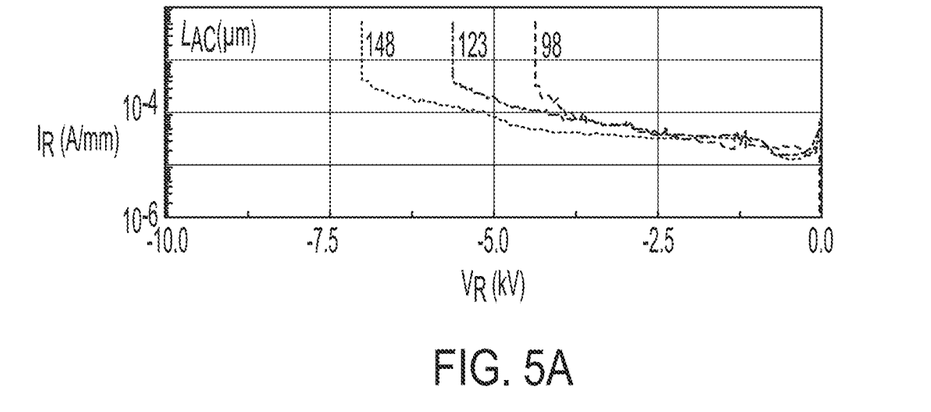
FIGS. 5A-5C show plots of reverse I-V characteristics of Schottky diodes.
Figure 5B:
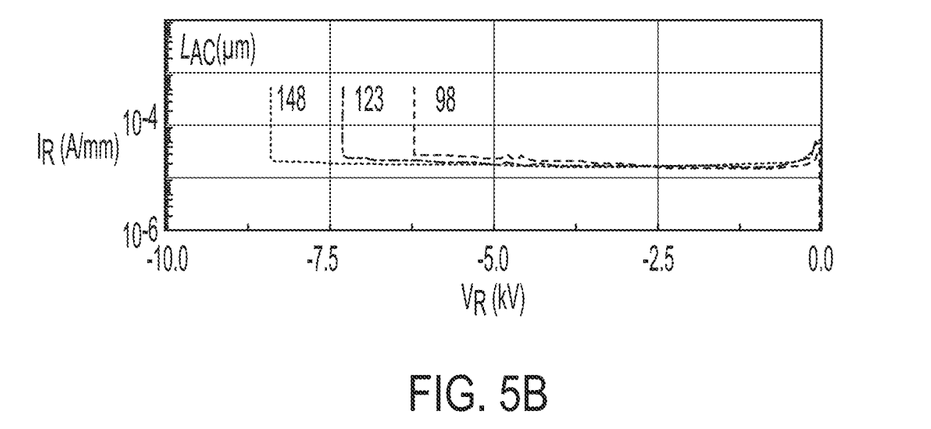
Figure 5C:
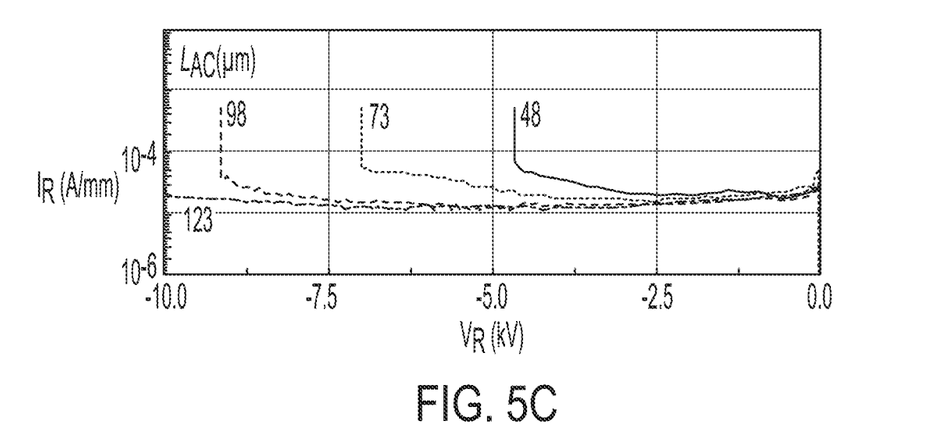

FIGS. 5A-5C show plots of reverse I-V characteristics of Schottky diodes. In particular, FIG. 5A shows the plots of the reverse I-V characteristics of Schottky diodes of various values of $L_{AC}$ without the second conductivity type material extending between and making contact with the anode material and the cathode material. FIG. 5B shows the plots of the revers I-V characteristics of Schottky diodes of various values of $L_{AC}$ with the second conductivity type material only partially extending near the anode material. FIG. 5C shows the plots of the revers I-V characteristics of Schottky diodes similar to those discussed above in relation to FIGS. 1-3B. The breakdown voltage of the Schottky diodes associated with FIG. 5C is about two times higher than that of the Schottky diodes associated with FIG. 5A, and about 1.5 times higher than that of the Schottky diodes associated with FIG. 5B. further, at a breakdown voltage of about 5 kV, the average electrical field for the Schottky diodes associated with FIG. 5C is greater than that for the both the Schottky diodes associated with FIGS. 5A and 5B.

Figure 6:
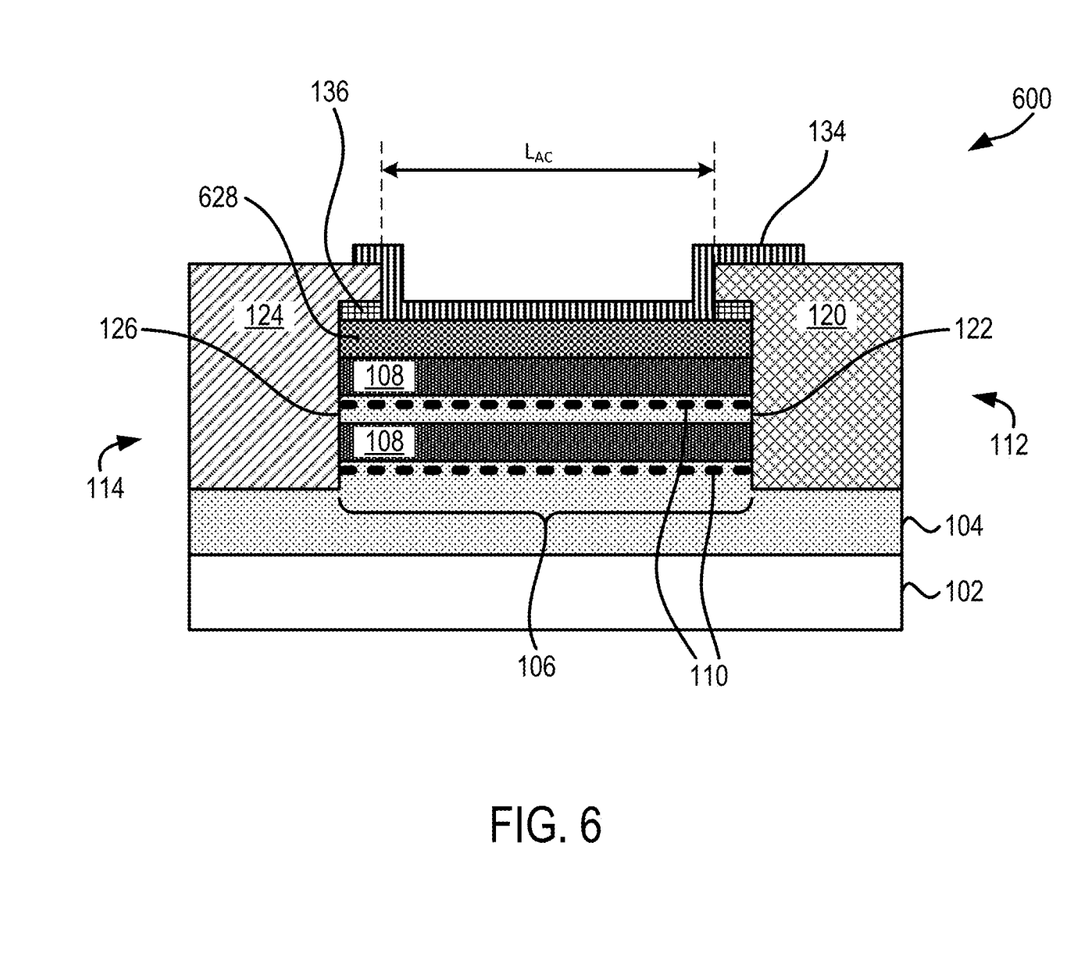
FIG. 6 shows a second example Schottky diode.
Like reference numbers and designations in the various drawings indicate like elements.

FIG. 6 shows a second example Schottky diode 600. The second example Schottky diode 600 is similar to the first example Schottky diode 100 discussed above in relation to FIG. 1, however, unlike the first Schottky diode 100 which includes the second conductivity type material 128 that is discontinuous between the anode material 124 and the cathode material 120, the second example Schottky diode 600 includes a second conductivity type material 628 that is continuous between the anode material 124 and second conductivity type material 128. As mentioned above, in some instances where the risk of punch-through is low, the second conductivity type material 628 can extend the entire distance $L_{AC}$ between the anode material 124 and the cathode material 120. The discussion above in relation to FIGS. 3A-5C apply equally to the second example Schottky diode 600.

References: All cited references, patent or literature, are incorporated by reference in their entirety. The examples disclosed herein are illustrative and not limiting in nature. Details disclosed with respect to the methods described herein included in one example or embodiment may be applied to other examples and embodiments. Any aspect of the present disclosure that has been described herein may be disclaimed, i.e., exclude from the claimed subject matter whether by proviso or otherwise.

[1] J. B. Casady, V. Pala, D. J. Lichtenwalner, E. V. Brunt, B. Hull, G. Wang, J. Richmond, S. T. Allen, D. Grider, and J. W. Palmour, "New Generation 10 kV SiC Power MOSFET and Diodes for Industrial Applications," in Proceedings of PCIM Europe 2015; International Exhibition and Conference for Power Electronics, Intelligent Motion, Renewable Energy and Energy Management, May 2015, pp. 1-8.

[2] H. Ohta, K. Hayashi, F. Horikiri, M. Yoshino, T. Nakamura, and T. Mishima, "5.0 kV breakdown-voltage vertical GaN p-n junction diodes," Jpn. J. Appl. Phys., vol. 57, no. 4S, p. 04FG09, February 2018.

[3] T. Hayashida, T. Nanjo, A. Furukawa, and M. Yamamuka, "Vertical GaN merged PiN Schottky diode with a breakdown voltage of 2 kV," Appl. Phys. Express, vol. 10, no. 6, p. 061003, May 2017.

[4] Y. Zhang and T. Palacios, "(Ultra) Wide-Bandgap Vertical Power FinFETs," IEEE Trans. Electron Devices, vol. 67, no. 10, pp. 3960-3971 October 2020.

[5] T. Oka, "Recent development of vertical GaN power devices," Jpn. J. Appl. Phys., vol. 58, no. SB, p. SB0805, April 2019.

[6] J. Liu, M. Xiao, Y. Zhang, S. Pidaparthi, H. Cui, A. Edwards, L. Baubutr, W. Meier, C. Coles, and C. Drowley, "1.2 kV Vertical GaN Fin JFETs with Robust Avalanche and Fast Switching Capabilities," in 2020 IEEE International Electron Devices Meeting (IEDM), December 2020, p. 23.2.1-23.2.4.

[7] A. Colón, E. A. Douglas, A. J. Pope, B. A. Klein, C. A. Stephenson, M. S. Van Heukelom, A. Tauke-Pedretti, and A. G. Baca, "Demonstration of a 9 kV reverse breakdown and 59 mΩ-cm2 specific on-resistance AlGaN/GaN Schottky barrier diode," Solid-State Electron, vol. 151, pp. 47-51, January 2019.

[8] H. Ishida, D. Shibata, H. Matsuo, M. Yanagihara, Y. Uemoto, T. Ueda, T. Tanaka, and D. Ueda, "GaN-based Natural Super Junction Diodes with Multi-channel Structures," in 2008 IEEE International Electron Devices Meeting (IEDM), December 2008.

[9] M. Xiao, Y. Ma, K. Cheng, K. Liu, A. Xie, E. Beam, Y. Cao, and Y. Zhang, "3.3 kV Multi-Channel AlGaN/GaN Schottky Barrier Diodes With P-GaN Termination," IEEE Electron Device Lett., vol. 41, no. 8, pp. 1177-1180 August 2020.

[10] J. Ma, C. Erine, M. Zhu, N. Luca, P. Xiang, K. Cheng, and E. Matioli, "1200 V Multi-Channel Power Devices with 2.8 (2 mm ON-Resistance," in 2019 IEEE International Electron Devices Meeting (IEDM), December 2019, p. 4.1.1-4.1.4.

[11] Y. Zhang, A. Zubair, Z. Liu, M. Xiao, J. Perozek, Y. Ma, and T. Palacios, "GaN FinFETs and trigate devices for power and RF applications: review and perspective," Semicond. Sci. Technol., vol. 36, no. 5, p. 054001, March 2021.

[12] M. Xiao, Y. Ma, Z. Du, X. Yan, R. Zhang, K. Cheng, K. Liu, A. Xie, E. Beam, Y. Cao, H. Wang, and Y. Zhang, "5 kV Multi-Channel AlGaN/GaN Power Schottky Barrier Diodes with Junction-Fin-Anode," in 2020 IEEE International Electron Devices Meeting (IEDM), December 2020, p. 5.4.1-5.4.4.

[13] S.-W. Han, J. Song, S. H. Yoo, Z. Ma, R. M. Lavelle, D. W. Snyder, J. M. Redwing, T. N. Jackson, and R. Chu, "Experimental Demonstration of Charge-Balanced GaN Super-Heterojunction Schottky Barrier Diode Capable of 2.8 kV Switching," IEEE Electron Device Lett., vol. 41, no. 12, pp. 1758-1761 December 2020.

[14] Y. Zhang, M. Sun, Z. Liu, D. Piedra, H. S. Lee, F. Gao, T. Fujishima, and T. Palacios, "Electrothermal Simulation and Thermal Performance Study of GaN Vertical and Lateral Power Transistors," IEEE Trans. Electron Devices, vol. 60, no. 7, pp. 2224-2230 July 2013.

[15] C. W. Tsou, K. P. Wei, Y. W. Lian, and S. S. H. Hsu, "2.07-kV AlGaN/GaN Schottky Barrier Diodes on Silicon With High Baliga's Figure-of-Merit," IEEE Electron Device Lett., vol. 37, no. 1, pp. 70-73, January 2016.

[16] J. Ma and E. Matioli, "2 kV slanted tri-gate GaN-on-Si Schottky barrier diodes with ultra-low leakage current," Appl. Phys. Lett., vol. 112, no. 5, p. 052101, January 2018.

[17] T. Zhang, J. Zhang, H. Zhou, Y. Wang, T. Chen, K. Zhang, Y. Zhang, K. Dang, Z. Bian, J. Zhang, S. Xu, X. Duan, J. Ning, and Y. Hao, "A>3 kV/2.94 mΩcm2 and Low Leakage Current With Low Turn-On Voltage Lateral GaN Schottky Barrier Diode on Silicon Substrate With Anode Engineering Technique," IEEE Electron Device Lett., vol. 40, no. 10, pp. 1583-1586 October 2019.

[18] J. Lynch, N. Yun, and W. Sung, "Design Considerations for High Voltage SiC Power Devices: An Experimental Investigation into Channel Pinching of 10 k V SiC Junction Barrier Schottky (JBS) Diodes," in 2019 31st International Symposium on Power Semiconductor Devices and ICs (ISPSD), May 2019, pp. 223-226.

[19] J. Millan, P. Friedrichs, A. Mihaila, V. Soler, J. Rebollo, V. Banu, and P. Godignon, "High-voltage SiC devices: Diodes and MOSFETs," in 2015 International Semiconductor Conference (CAS), October 2015, pp. 11-18.

[20] J. Schoeck, J. Buettner, M. Rommel, T. Erlbacher, and A. J. Bauer, "4.5 kV SiC Junction Barrier Schottky Diodes with Low Leakage Current and High Forward Current Density," Mater. Sci. Forum, vol. 897, pp. 427-430, 2017.

[21] R. Ghandi, A. Bolotnikov, D. Lilienfeld, S. Kennerly, and R. Ravisekhar, "3 kV SiC Charge-Balanced Diodes Breaking Unipolar Limit," in 2019 31st International Symposium on Power Semiconductor Devices and ICs (ISPSD), May 2019, pp. 179-182.

[22] W. Li, K. Nomoto, Z. Hu, D. Jena, and H. G. Xing, "Field-Plated Ga2O3 Trench Schottky Barrier Diodes With a BV2/RON, SP of up to 0.95 GW/cm2," IEEE Electron Device Lett., vol. 41, no. 1, pp. 107-110, January 2020.

[23] Z. Hu, H. Zhou, Q. Feng, J. Zhang, C. Zhang, K. Dang, Y. Cai, Z. Feng, Y. Gao, X. Kang, and Y. Hao, "Field-Plated Lateral β-Ga2O3 Schottky Barrier Diode With High Reverse Blocking Voltage of More Than 3 kV and High DC Power Figure-of-Merit of 500 MW/cm2," IEEE Electron Device Lett., vol. 39, no. 10, pp. 1564-1567 October 2018.

[24] R. Zhang, J. P. Kozak, M. Xiao, J. Liu, and Y. Zhang, "Surge-Energy and Overvoltage Ruggedness of P-Gate GaN HEMTs," IEEE Trans. Power Electron., vol. 35, no. 12, pp. 13409-13419, December 2020.

[25] "GAP3SLT33-214 GeneSiC Semiconductor|Discrete Semiconductor Products." [online available] https://www.digikey.com/en/products/detail/genesic-semiconductor/GAP3SLT33-214/3904847?s=N4IgjCBcoLQBxVAYyg-MwIYBsDOBTANCAPZQDa4ATACwUgC 6Avg4bZOQOICCACgMwDKAGQAqvXjApgq9B kA (accessed Mar. 22, 2021).

[26] Y. Zhang, A. Dadgar, and T. Palacios, "Gallium nitride vertical power devices on foreign substrates: a review and outlook," J. Phys. Appl. Phys., vol. 51, no. 27, p. 273001, 2018.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein but are to be accorded the widest scope consistent with this disclosure, the principles and the novel features disclosed herein.

What is claimed is:

1. A diode, comprising:
a semiconductor region having at least one two-dimensional carrier channel of a first conductivity type, the first conductivity type being one of a n-type and a p-type conductivity, the at least one two-dimensional channel having a net charge, the semiconductor region having a heterostructure that includes a first material layer and a second material layer, the first material layer and the second material layer forming an electron gas (2DEG) channel at an interface of the first material layer and the second material layer;
a material of a second conductivity type, the second conductivity type being the other of the n-type and the p-type conductivity, disposed on the heterostructure of the semiconductor region, the material of the second conductivity type having a net charge in a depletion region that is substantially equal to the net charge of the at least one two-dimensional channel in the semiconductor region when the diode is under reverse bias;
an anode material in contact with at least a portion of the at least one two-dimensional channel and in contact with at least a portion of the material of the second conductivity type; and
a cathode material in contact with the at least one two-dimensional carrier channel, the 2DEG channel of the heterostructure extending from the cathode material to the anode material.

2. The diode of claim 1, wherein the net charge of the material of the second conductivity type is a function of a thickness of the depletion region of the material of the second conductivity type and an acceptor/donor concentration in the depletion region of the material of the second conductivity type.

3. The diode of claim 1, wherein the material of the second conductivity type includes a first portion in contact with the anode material and a second portion in contact with the cathode material, wherein the first portion and the second portion are not in mutual contact.

4. The diode of claim 3, further comprising a passivation material disposed between the first portion and the second portion and in contact with the semiconductor region.

5. The diode of claim 1, wherein the material of the second conductivity type makes contact with the anode material but does not make contact with the cathode material.

6. The diode of claim 5, further comprising a passivation material disposed between the material of the second conductivity type and the cathode material.

7. The diode of claim 1, wherein the material of the second conductivity type makes contact with both the anode material and the cathode material.

8. The diode of claim 1, wherein under reverse bias, the material of the second conductivity type forms the depletion region adjacent to the semiconductor region, wherein the net charge in the depletion region is substantially equal to the net charge of the at least one two-dimensional channel in the semiconductor region.

9. The diode of claim 8, wherein the reverse bias is at least 10 V.

10. The diode of claim 8, wherein a portion of the anode material forms a Schottky contact with the portion of the semiconductor region, and wherein the depletion region is positioned between the Schottky contact and the cathode material.

11. The diode of claim 1, wherein the net charge of the at least one two-dimensional channel is equal to a sum of net charges of all two-dimensional channels of the at least one two-dimensional channel.

12. The diode of claim 1, wherein the semiconductor region includes at least two III-nitride materials that form the heterostructure with alternating layers.

13. The diode of claim 1, further comprising:
a substrate layer; and
a buffer layer disposed over the substrate layer, wherein the semiconductor region having the at least one two-dimensional carrier channel of a first conductivity type is disposed over the buffer layer.

14. The diode of claim 1, wherein the first material layer comprises an aluminum gallium nitride material and the second material layer comprises a gallium nitride material.

15. The diode of claim 1, wherein the material of the second conductivity type is doped in a graded configuration.

16. The diode of claim 1, wherein the material of the second conductivity type is doped in a bulk configuration.

17. The diode of claim 1, wherein the at least one two-dimensional channel of the semiconductor region is a first at least one two-dimensional channel, and wherein the material of the second conductivity type includes a second two-dimensional channel.

18. The diode of claim 1, wherein the cathode material forms an ohmic contact with the at least one two-dimensional channel.

19. The diode of claim 1, wherein the material of the second conductivity type has a net charge that is within 30% of the net charge of the at least one two-dimensional channel in the semiconductor region.

20. The diode of claim 1, wherein the 2DEG channel is a first 2DEG channel, and the heterostructure further comprises a second 2DEG channel that extends from the cathode material to the anode material.

* * * * *